United States Patent [19]
Nichols et al.

[11] Patent Number: 5,759,007
[45] Date of Patent: Jun. 2, 1998

[54] NOTCH FINDER AND COMBINATION WAFER TRANSFER MACHINE

[75] Inventors: Ernest C. Nichols, Boise; Brian D. Brown, Nampa; Timothy A. Strodtbeck; Kevin A. Larsen, both of Boise; Shelby K. Moore; John S. Molebash, both of Meridian, all of Id.

[73] Assignee: Micron Technology, Inc., Boise, Id.

[21] Appl. No.: 742,897

[22] Filed: Nov. 1, 1996

[51] Int. Cl.$^6$ .................................................. B65G 47/24
[52] U.S. Cl. ................. 414/417; 414/757; 414/936; 414/937
[58] Field of Search .................... 198/394; 414/417, 414/757, 936, 937; 74/670

[56] References Cited

U.S. PATENT DOCUMENTS

| | | | |
|---|---|---|---|
| 166,468 | 8/1875 | King | 74/670 |
| 203,621 | 5/1878 | Hill | 74/670 |
| 4,662,811 | 5/1987 | Hayden | 414/757 X |
| 4,813,840 | 3/1989 | Prabhakar et al. | 414/757 X |
| 5,383,759 | 1/1995 | Lin | 414/936 X |

FOREIGN PATENT DOCUMENTS

| | | | |
|---|---|---|---|
| 104132 | 5/1987 | Japan | 414/937 |
| 1-186643 | 7/1989 | Japan | 414/936 |

OTHER PUBLICATIONS

H-Square Corporation 1994–1995 Edition pp. 8–1 through 8–4.
H-Square Corporation 1994–1995 Edition pp. 6–1 through 6–6, 7–1, 2.

*Primary Examiner*—Janice L. Krizek
*Attorney, Agent, or Firm*—Ormiston Korfanta Dunbar & Holland, PLLC

[57] ABSTRACT

The invention provides a manually operated machine for radially aligning one or more semiconductor wafers. The machine includes an elongated first "notch" roller for rotatably engaging the edge of the wafers, a gear train, and a hand crank for manually rotating the first roller in cooperation with the gear train. The wafers are aligned according to the notches as the wafers are engaged and rotated by the notch roller until the notch in each wafer falls over and is disengaged by that roller. The manual notch finder may also include an elongated second "position" roller for rotatably engaging the edge of the wafers. The position roller is disposed laterally near the notch roller and sized and shaped to engage the edge of the wafers fully along the periphery of each wafer so that the aligned wafers can be positioned to any degree of radial orientation. The invention also provides a combination notch or flat finder machine integrated with a wafer transfer machine. The combination machine includes a base plate, a translatable transfer arm, and a notch finder machine such as that described above, or a flat finder machine.

16 Claims, 12 Drawing Sheets

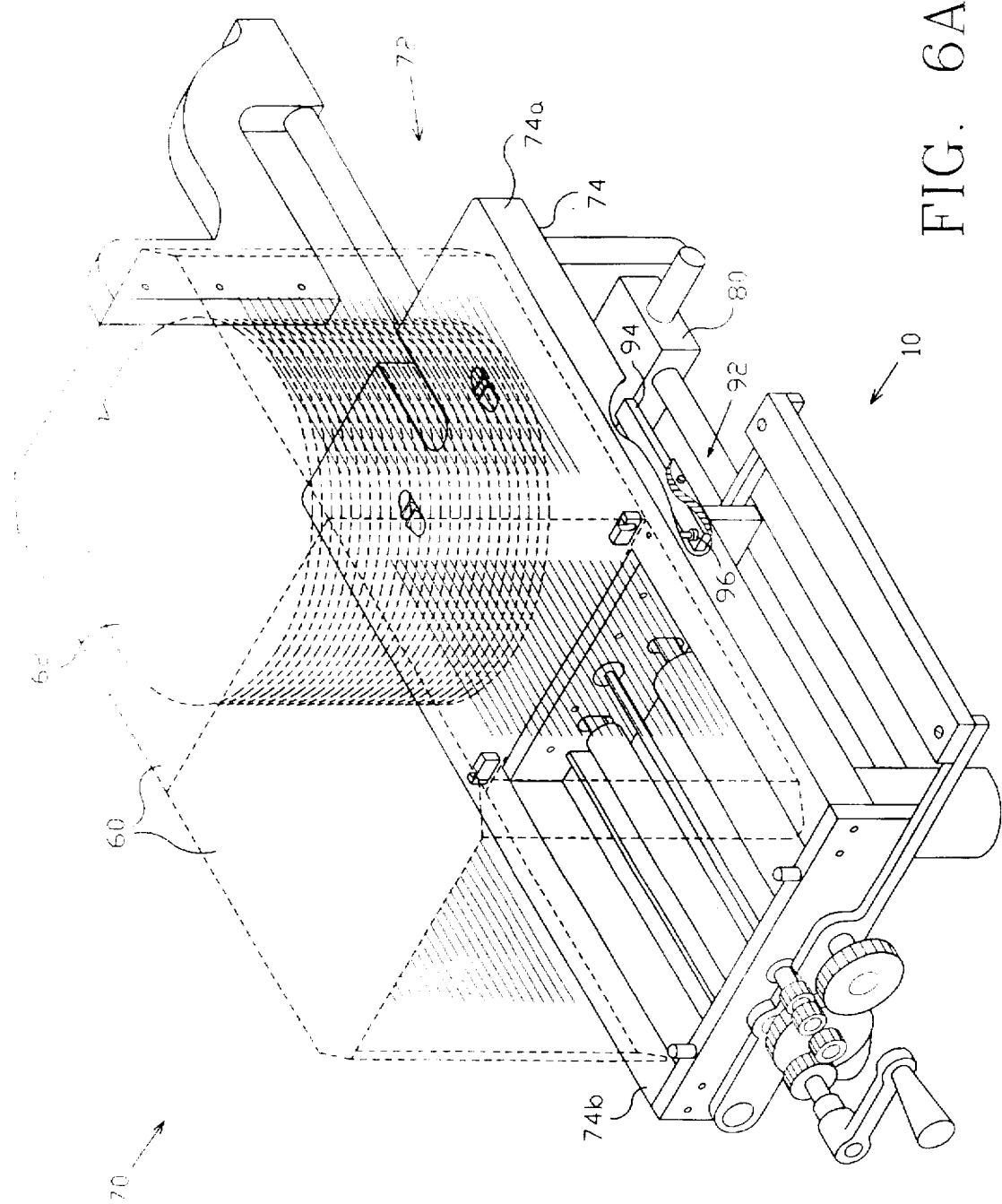

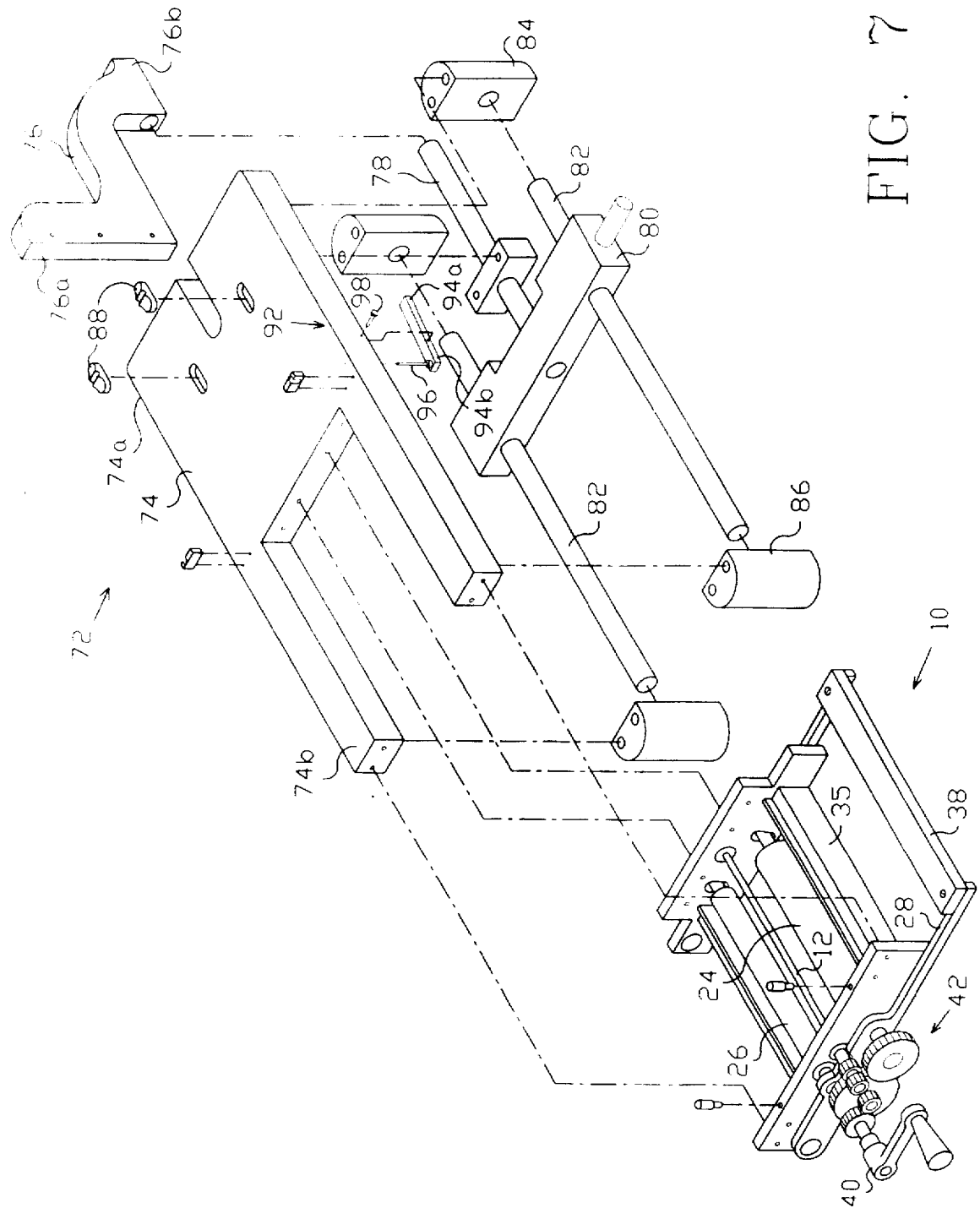

NOTCH FINDER AND COMBINATION WAFER TRANSFER MACHINE

FIELD OF THE INVENTION

The invention relates generally to semiconductor manufacturing equipment and, more particularly, to a manual notch finder and a combination wafer transfer machine.

BACKGROUND OF THE INVENTION

Semiconductor devices are mass produced by forming many identical circuit patterns on a single silicon wafer which is thereafter cut into many identical dies or "chips." Semiconductor devices, also commonly referred to as integrated circuits, are typically constructed by successively depositing or "stacking" layers of various materials on the wafer. Each layer is patterned as necessary to form the desired circuit components. To ensure reliable and predictable operation of integrated circuits, the wafer and deposited materials must be free from contamination. Hence, many fabrication processes must be performed in an environment that is essentially free from contamination. For example, the contamination level requirement for Class 1 cleanliness in semiconductor wafer processing areas or "clean rooms" is less than one part (contaminates) per cubic foot. To achieve this high degree of cleanliness, special high volume ventilation systems are used to continuously filter the air. These systems represent a significant contribution to the overall cost of manufacturing semiconductor devices. Accordingly, cost savings can be realized by minimizing the size of the clean rooms and by making the most efficient use of all available clean room space.

During manufacture, semiconductor wafers are stored, processed and transported in carriers that have a series of parallel slots, each of which receives and holds a single wafer. The carriers are also commonly referred to as wafer cassettes or "boats." Most wafer carriers hold up to twenty five wafers. Many wafer carriers are not suitable for exposure to all of the different environmental conditions encountered during processing. As a result, the wafers have to be transferred between boats at various times during the production of the semiconductor devices. Wafer transfer machines are used to perform this task. Manually operated wafer transfer machines allow the operator to push the wafers from one carrier into another carrier as may be necessary to support different manufacturing processes. Also during manufacture, the wafers in a wafer carrier must be aligned periodically to, for example, read the scribe numbers on the edge of the wafers, maintain a uniform orientation during certain operations, and identify damaged areas on a wafer by surface location. To facilitate the alignment of the wafers, either a notch or flat spot is formed in the edge of each wafer. These "notches" or "flats" are used to radially align all of the wafers in a carrier. This is accomplished using a rotating roller that engages the edges of all of the wafers in the carrier to simultaneously rotate each wafer. The wafers rotate until the notch reaches the roller, at which point the roller can no longer engage the circular edge of the wafer and that wafer stops rotating. The roller continues to rotate until all of the notches are oriented over the roller and the wafers are fully aligned.

Currently, separate machines are used to transfer wafers between carriers and to align the wafers within a carrier. It would be advantageous to combine the transfer and alignment functions of conventional wafer transfer and notch/flat finding machines into a single integrated machine to promote the efficient use of clean room space. In addition, so far as applicants are aware, there are no fully manual notch finders. It would be advantageous to utilize a fully manual notch finder as a lower cost alternative to the motor driven notch finders that are now used to align wafers during fabrication of semiconductor devices.

SUMMARY OF THE INVENTION

The present invention is directed, in part, to a manually operated notch finder that may be operated at speeds comparable to that of motor driven notch finders and also allows the alignment of the wafers to any degree of radial orientation. The invented manual notch finder and positioning machine can be made and operated at a lower cost than motor driven notch finders. The present invention is also directed to a combination machine that incorporates into one machine the notch/flat finding and wafer transfer functions currently performed by separate machines.

One embodiment of the invention provides a manually operated machine for radially aligning one or more semiconductor wafers. The machine includes an elongated first "notch" roller for rotatably engaging the edge of the wafers, a gear train, and a hand crank for manually rotating the first roller in cooperation with the gear train. The notch roller is sized and shaped to fit within the notch and therein disengage the edge of the wafers. Thus, the wafers will be aligned according to the notches as the wafers are engaged and rotated by the notch roller until the notch in each wafer falls over and is disengaged by that roller. The manual notch finder may also include an elongated second "position" roller for rotatably engaging the edge of the wafers. The position roller is disposed laterally near the notch roller and sized and shaped to engage the edge of the wafers fully along the periphery of each wafer so that the aligned wafers can be positioned to any degree of radial orientation.

Another embodiment of the invention provides a combination wafer notch finder and transfer machine. The combination machine includes a base plate, a translatable transfer arm, and a notch finder machine such as that described above. The transfer arm is positioned adjacent to one end of the base plate. The transfer arm is operable to traverse at least a part of the base plate to push wafers from the transferor carrier into the receiver carrier. The notch finder machine is mounted on a portion of the base plate opposite the transfer arm.

The wafer transfer machine is combined with a flat finder machine in another embodiment of the combination machine. In this embodiment of the invention, the flat finder machine, which radially aligns one or more semiconductor wafers according to a flat on the edge of each wafer, is mounted on one end of the base plate opposite the transfer arm. The flat finder machine will typically include an elongated roller for rotatably engaging the edge of the wafers, and a hand crank for manually rotating the roller.

Both combination machines may be fitted with a lockout device that prevents the transfer arm from moving to push wafers out of a transferor carrier unless and until a receiver carrier is properly positioned on the machine. The preferred version of the lockout device comprises a stop pivotally mounted to the bottom surface of the base plate and a release pin slidably inserted through the base plate. The stop has a pivotal axis that defines forward and rearward portions of the stop. The pivotal axis is located rearward of the center of the stop. The release pin is located above the rearward portion of the stop. The first end of the release pin contacts the rearward portion of the stop. The second end of the release pin extends above the top surface of the base plate.

The lockout device is operative between an engaged position, wherein the forward portion of the stop is pivoted down to prevent the transfer arm from moving to push wafers out of the transferor carrier, and a disengaged position wherein the release pin is depressed to pivot the forward portion of the stop up to allow the transfer arm to move to push wafers out of the transferor carrier.

BRIEF DESCRIPTION OF THE DRAWINGS

FIG. 6A is an isometric view of the combination notch finder and wafer transfer machine of FIG. 6 showing a pair of wafer carriers in place on the machine for performing the wafer transfer function.

FIG. 7 is an exploded isometric view of the wafer transfer machine portion of the combined machine of FIG. 6.

DETAILED DESCRIPTION OF THE INVENTION

Figure 1:
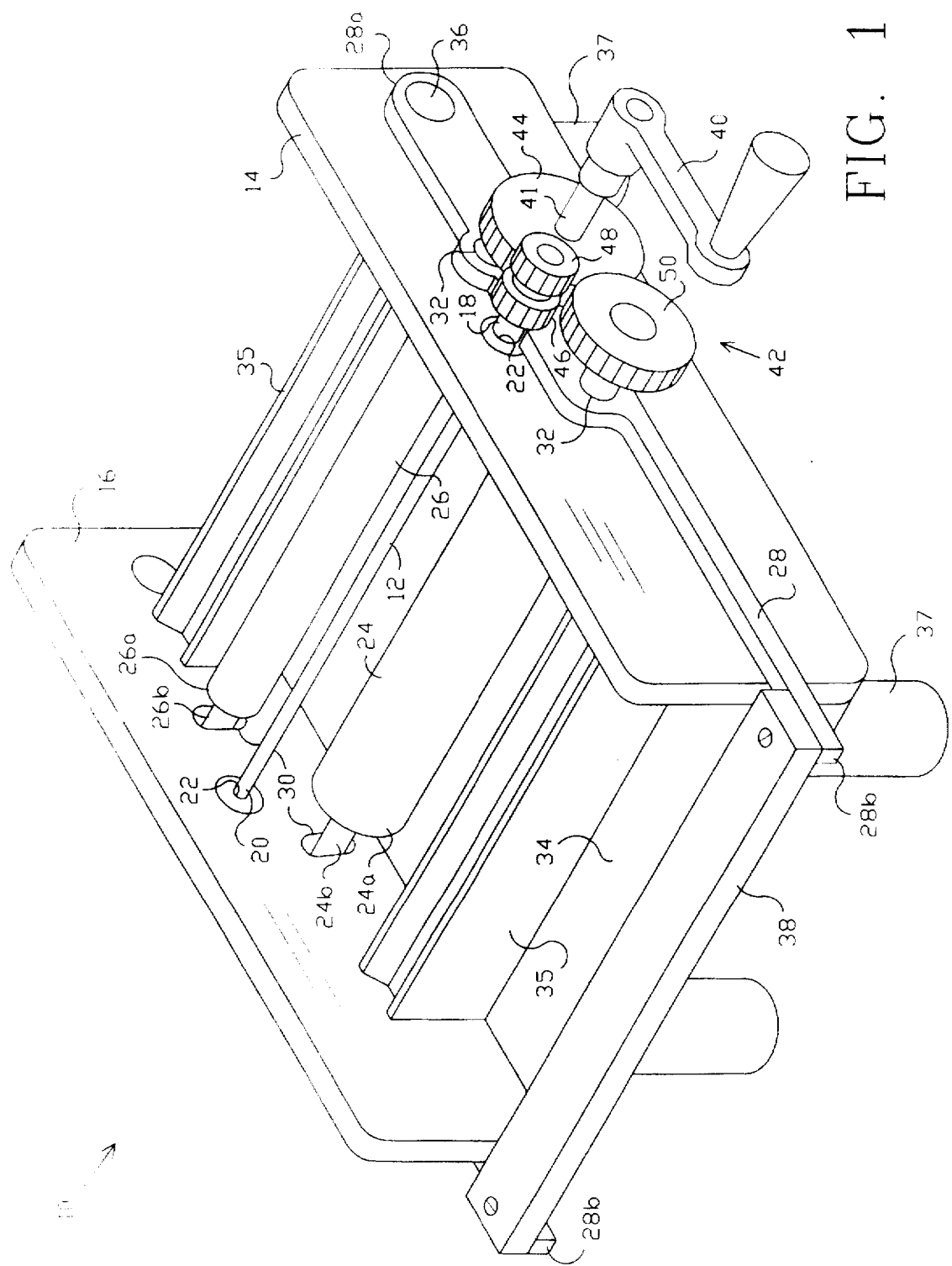
FIG. 1 is an isometric view of one embodiment of the manual notch finder and positioning machine of the present invention.
Figure 2:
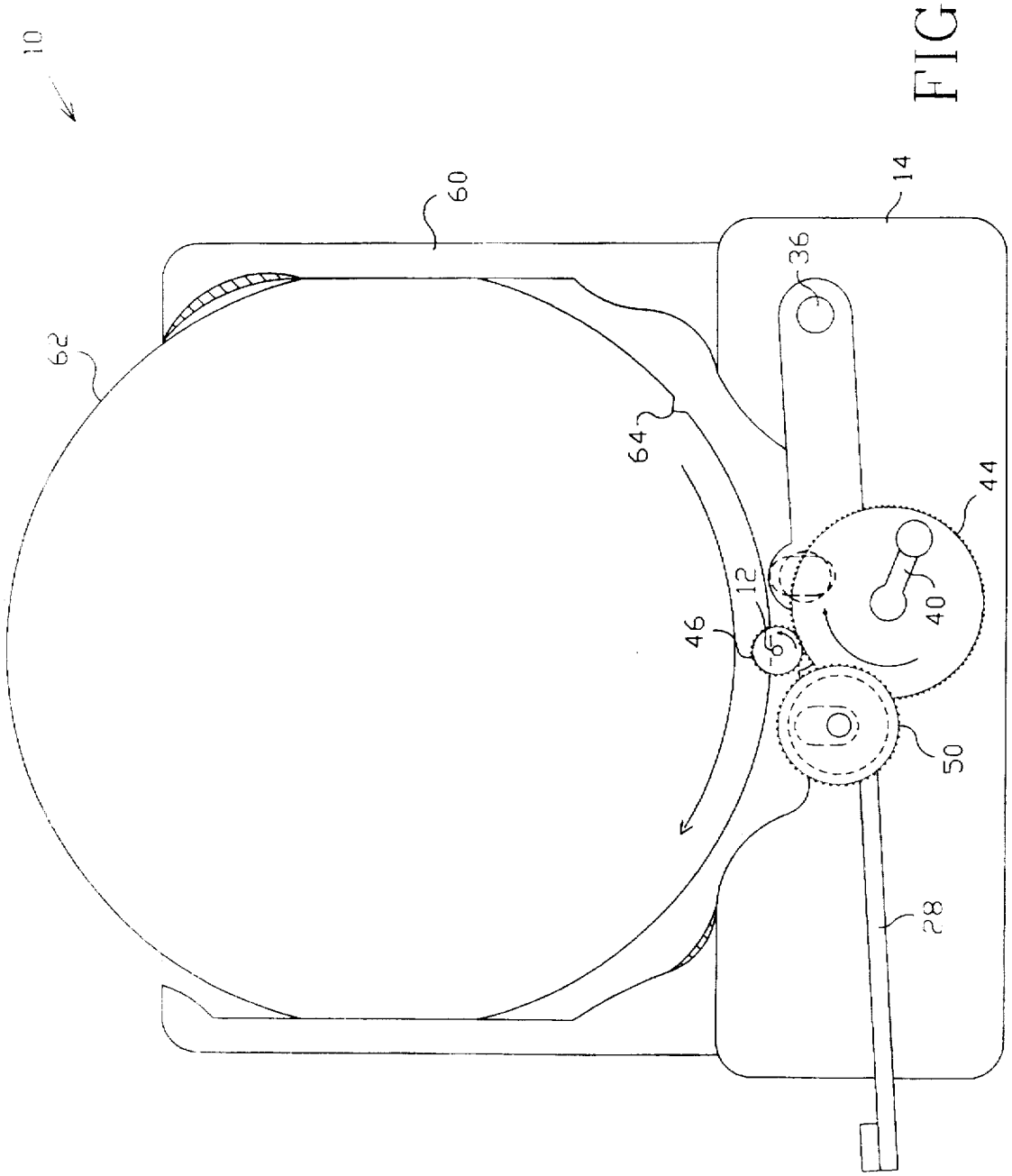
FIG. 2 is an elevation side view of the machine of FIG. 1 showing the lever arms down so that the position roller is disengaged from the hand crank and the wafers.
Figure 3:
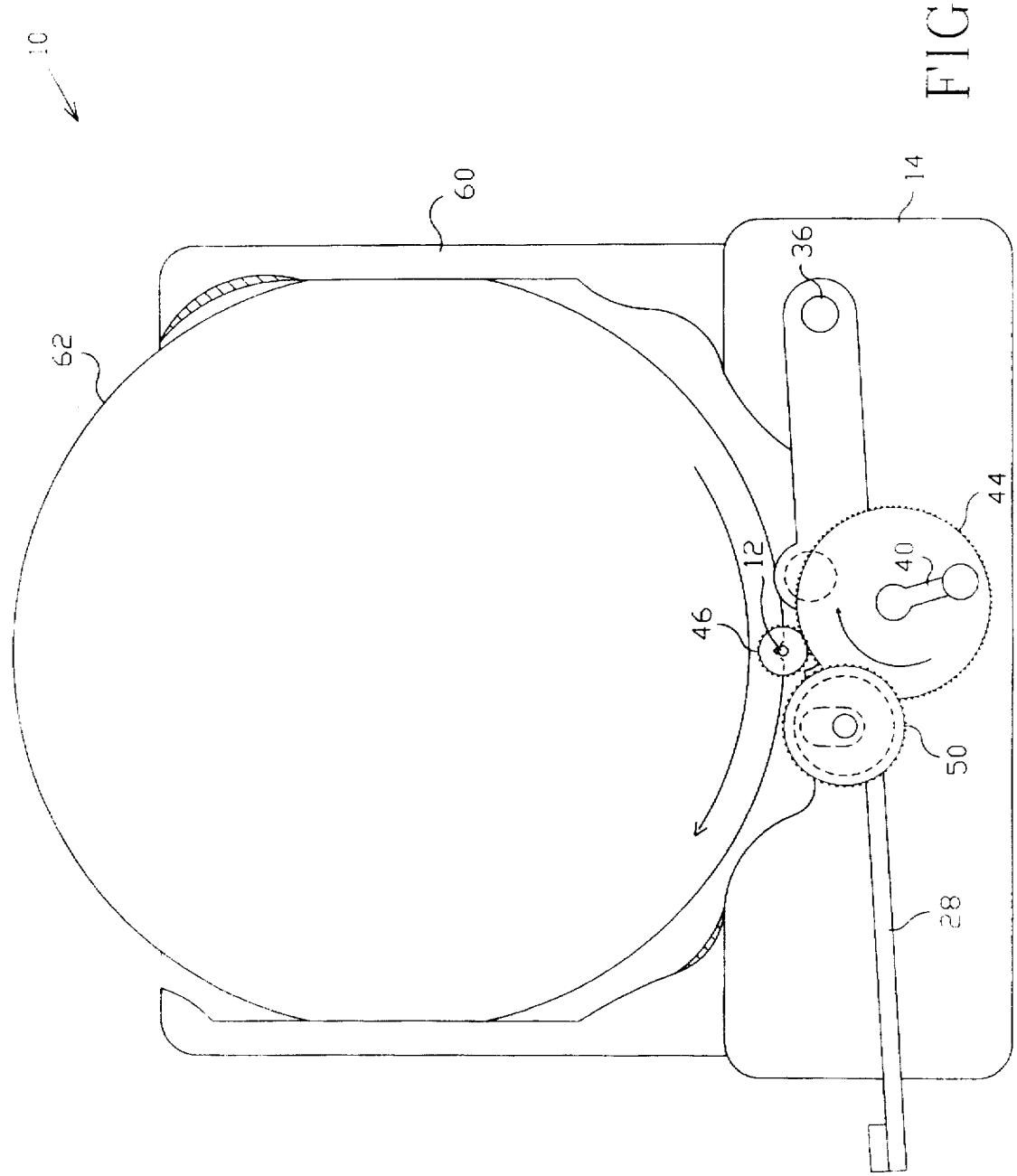
FIG. 3 is an elevation side view of the machine of FIG. 1 showing the notch in the wafers aligned over the notch roller.
Figure 4:
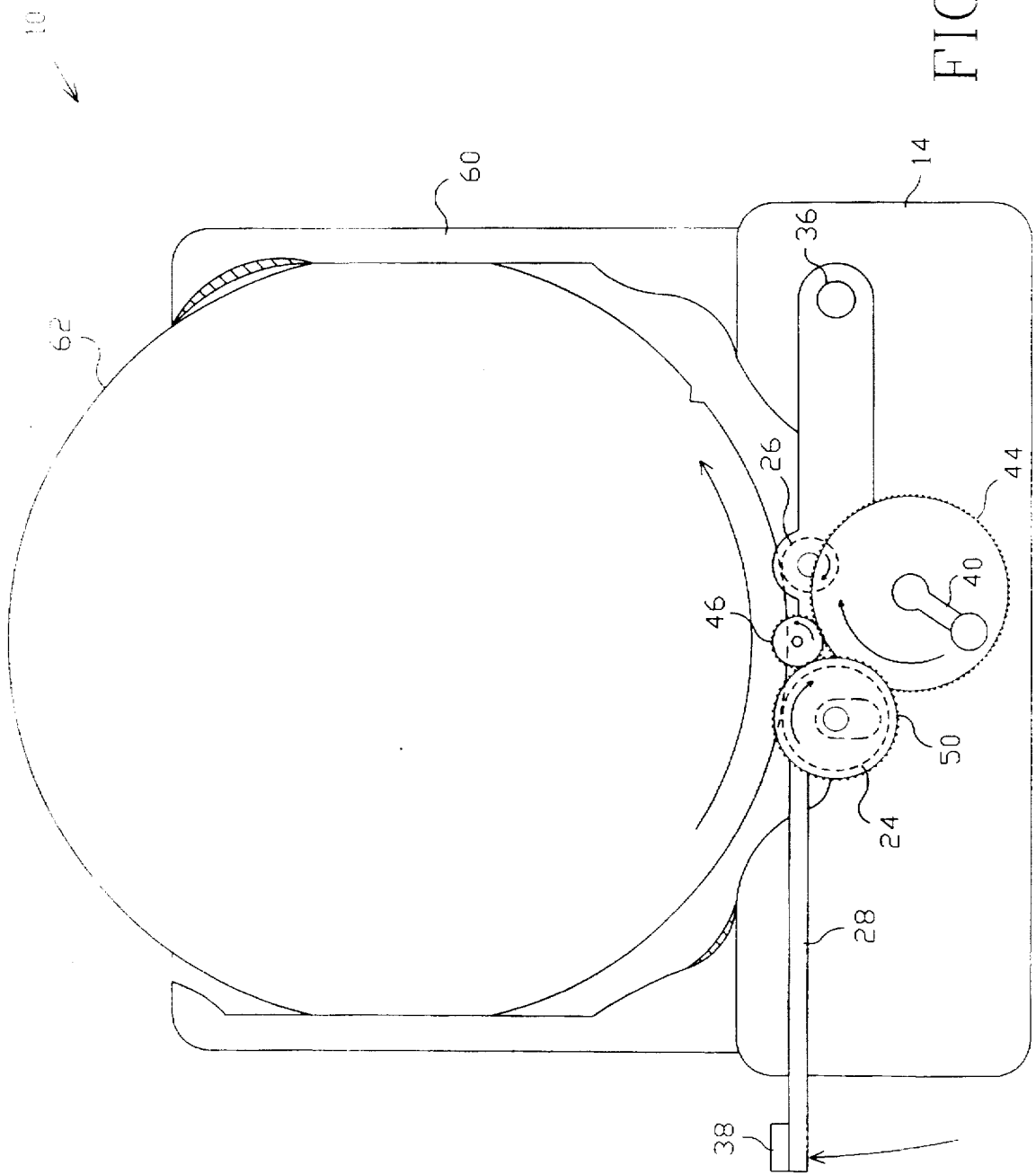
FIG. 4 is an elevation side view of the machine of FIG. 1 showing the lever arm up so that the positioning roller is engaged with the hand crank and the edge of the wafers to lift the wafers off the notch roller and, as desired, to reposition the wafers.

FIGS. 1–4 are various views of a manual notch finder and wafer positioning machine constructed according to one of the exemplary embodiments of the invention. The manual notch finder and wafer positioning machine is indicated generally by reference numeral 10. An elongated cylindrical notch roller 12 is rotatably mounted in and supported by flat generally rectangular first and second side plates 14, 16. The diameter of notch roller 12 is smaller than notch 64 in wafers 62. Preferably, notch roller 12 is positioned directly below the center of the wafers, as shown in FIGS. 2–4. First and second ends 18, 20 of notch roller 12 extend through circular holes 22 in side plates 14, 16, respectively. Preferably, holes 22 are fitted with a bushing, bearing or the like to better allow notch roller 12 to turn in holes 22. Position roller 24 and support roller 26 are rotatably mounted on and supported by lift arms 28. Position roller 24 and support roller 26 are located on opposite sides of and laterally adjacent to notch roller 12. Position roller 24 includes a larger diameter center roller portion 24a and smaller diameter shaft portions 24b. Preferably, roller portion 24a and shaft portions 24b are made as an integral unit to form position roller 24. Alternatively, position roller 24 may be formed from two separate pieces, i.e., a roller fixedly mounted on a shaft. Support roller 26 includes a larger diameter center roller portion 26a and smaller diameter shaft portions 26b. Preferably, roller portion 26a and shaft portions 26b are made as an integral unit to form support roller 26. Alternatively, support roller 26 may be formed from two separate pieces, e.g., a roller fixedly mounted on a shaft. Shaft portions 24b and 26b of position roller 24 and support roller 26 extend through elongated holes 30 in side plates 14, 16 and into circular holes 32 in lift arms 28. Preferably, holes 32 are fitted with a bushing, bearing or the like to better allow rollers 24 and 26 to turn in holes 32.

Side plates 14, 16 are mounted on opposing sides of frame 34. Frame 34 is mounted on legs 37. A pair of wafer carrier guides 35 extend between side plates 14, 16 on either side of rollers 24 and 26. Guides 35 are configured to hold a conventional wafer carrier, indicated generally by reference numeral 60 in FIGS. 2–4, so that wafers 62 in carrier 60 are positioned above and in contact with notch roller 12 and notch roller 12 engages the edge of the wafers directly below the center of each wafer. Pivot ends 28a of lift arms 28 are attached to side plates 14, 16 at pivot points 36. Lift bar 38 is attached to and extends between lift ends 28b of lift arms 28. Lift arms 28 are operative between a lowered position and a raised position, as described in more detail below.

Notch roller 12 and position roller 24 are manually driven by hand crank 40 in cooperation with gear train 42. Hand crank 40 is operatively coupled to rollers 12 and 24 through crank shaft 41 and gear train 42. Crank shaft 41 is connected to hand crank 40. Gear train 42 includes drive gear 44, notch roller gear 46, coupling gear 48 and position roller gear 50. Drive gear 44 is mounted on the end of crank shaft 41. Notch roller gear 46 is mounted on first end 18 of notch roller 12 laterally adjacent to and aligned with drive gear 44 so that notch roller gear 46 continuously engages drive gear 44. Notch roller gear 46 is mounted on notch roller 12 a distance from first side plate 14 sufficient to allow lift arm 28 to move freely up and down between first side plate 14 and notch roller gear 46. Coupling gear 48 is mounted on first end 18 of notch roller 12. Coupling gear 48 is positioned outside of notch roller gear 46 on notch roller 12. Position roller gear 50 is mounted on the end of shaft 24b laterally adjacent to and aligned with coupling gear 48 so that coupling gear 48 engages position roller gear 50 when lift arms 28 are in the raised position, but not when lift arms 28 are in the lowered position.

In operation, wafer carrier 60 having wafers 62 randomly aligned therein is placed on guides 35. Lift arms 28 are initially in the lowered position wherein only notch roller 12 engages the edges of wafers 62, as shown in FIGS. 2 and 3. Also, in this position, only notch roller gear 46 and drive gear 44 are engaged. Upon rotation of hand crank 40, drive gear 44 drives notch roller gear 46 causing notch roller 12 to rotate against the edge of wafers 62. Each wafer is thereby rotated until notch 64 falls over notch roller 12. Thereafter, notch roller 12 spins in notch 64 to prevent further rotation of the wafer. After all of the wafers are aligned, that is, after all the notches have been "found," lift arms 28 are moved to the raised position by lifting lift bar 38 as shown in FIG. 4. As lift arms 28 pivot about pivot points 36, position roller 24 and support roller 26 lift wafers 62 off notch roller 12 so that the wafers can be rotated unobstructed by notch roller 12. With lift arms 28 in the raised position, only position roller 24 and support roller 26 engage the edges of wafers 62. Also, position roller gear 50 engages coupling gear 48 so that position roller 24 is drivingly connected to hand crank 40. Upon rotation of hand crank 40, drive gear 44 drives coupling gear 48 (though notch roller gear 46) which in turn drives position roller gear 50 causing position roller 24 to rotate against the edge of wafers 62. The wafers are thereby rotated in unison to the desired position.

The range of motion of lift arms 28 is, preferably, defined by the length of elongated holes 30 in side plates 14, 16. The range of motion necessary to achieve the desired positioning of position and support rollers 24 and 26 will vary depending on the size of these rollers, the size of their respective roller and shaft portions 24a, 24b, 26a, 26b, and the distance between these components and pivot points 36. These parameters may be adjusted as necessary so that each roller properly engages the wafers when lift arms 28 are in the raised position and so that each roller clears the wafers when lift arms 28 are in the lowered position.

Figure 5:
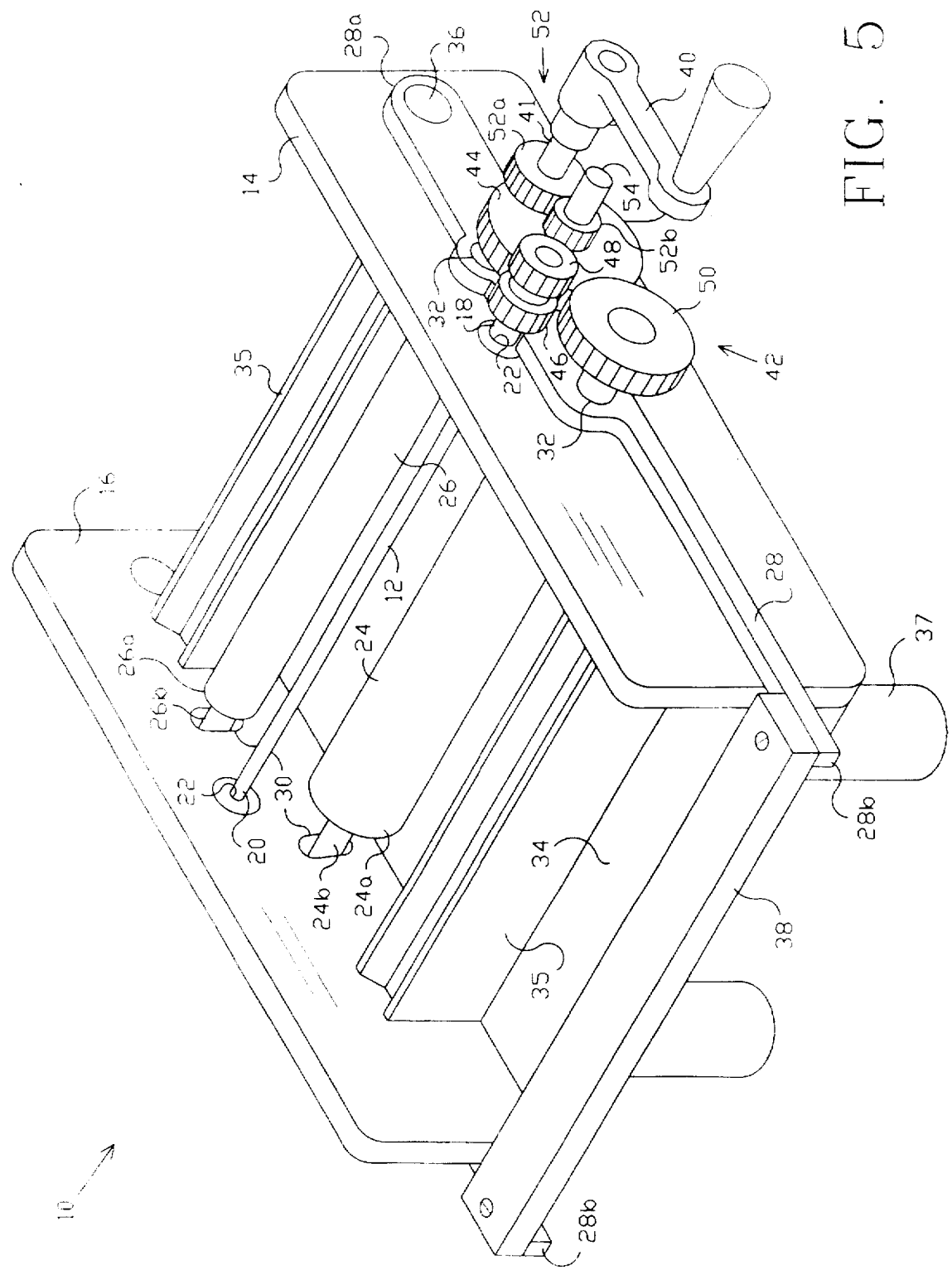
FIG. 5 is an isometric view of an alternative embodiment of the notch finder machine wherein the gear train includes an intermediate pair of gears to increase the step up gear ratios.

Hand crank 40 and the various components of gear train 42 may be configured and sized as necessary to achieve the desired comparative rates of rotation for hand crank 40 and rollers 12 and 24 and, correspondingly, for wafers 62. For example, the configuration of gear train 42 illustrated in FIG. 5 includes a set of step up gears 52a, 52b interposed between hand crank 40 and drive gear 44. A first driving step up gear 52a is mounted on crank shaft 41. A second driven step up gear 52b is mounted on gear shaft 54 laterally adjacent to and aligned with first step up gear 52a so that first step up gear 52a continually engages second step up gear 52b. Drive gear 44 is also mounted on gear shaft 54. Crank shaft 41 and gear shaft 54 are supported by a gear box (not shown) or other suitable supporting structure.

Figure 6:
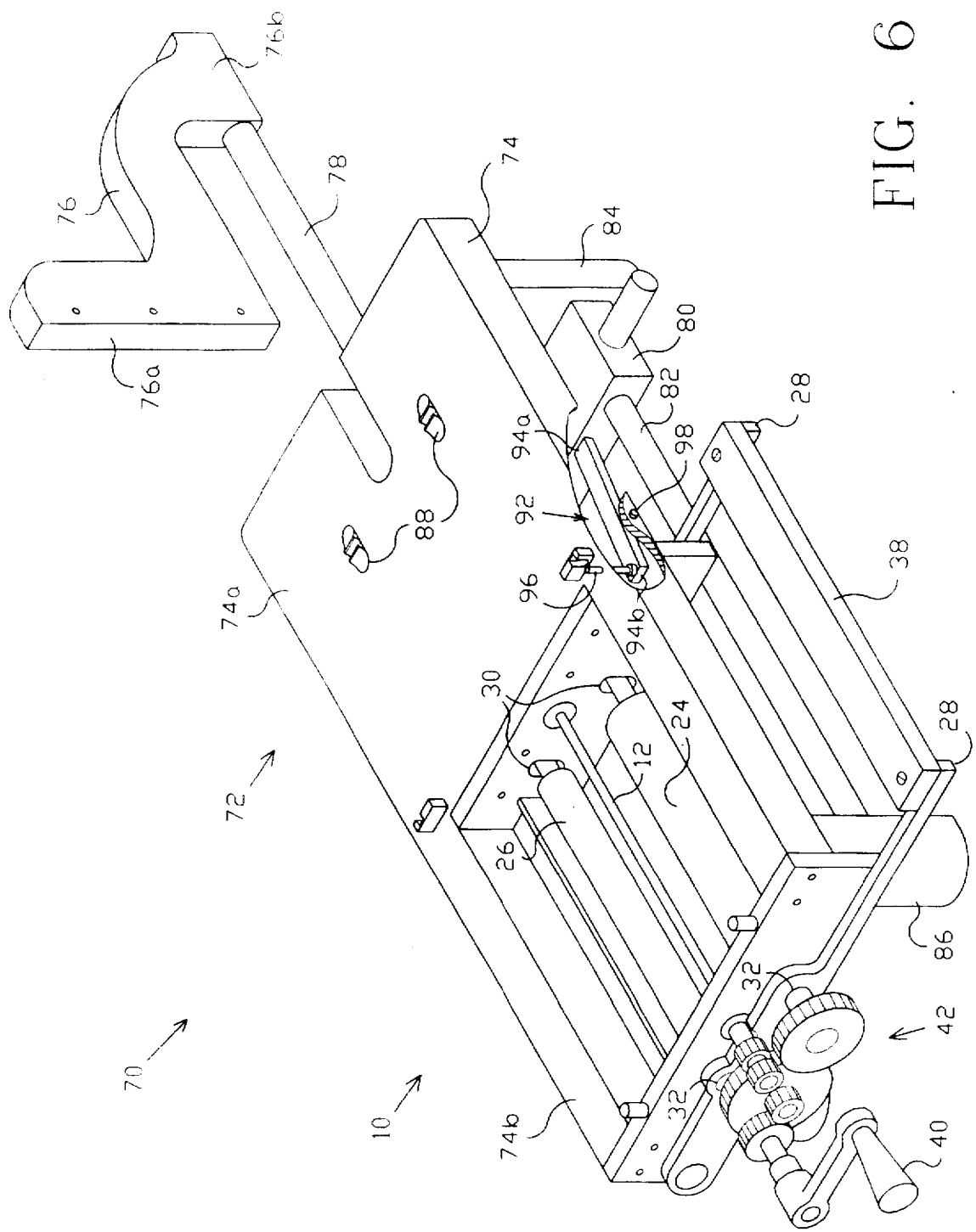
FIG. 6 is an isometric view of the combination notch finder and wafer transfer machine.
Figure 6B:
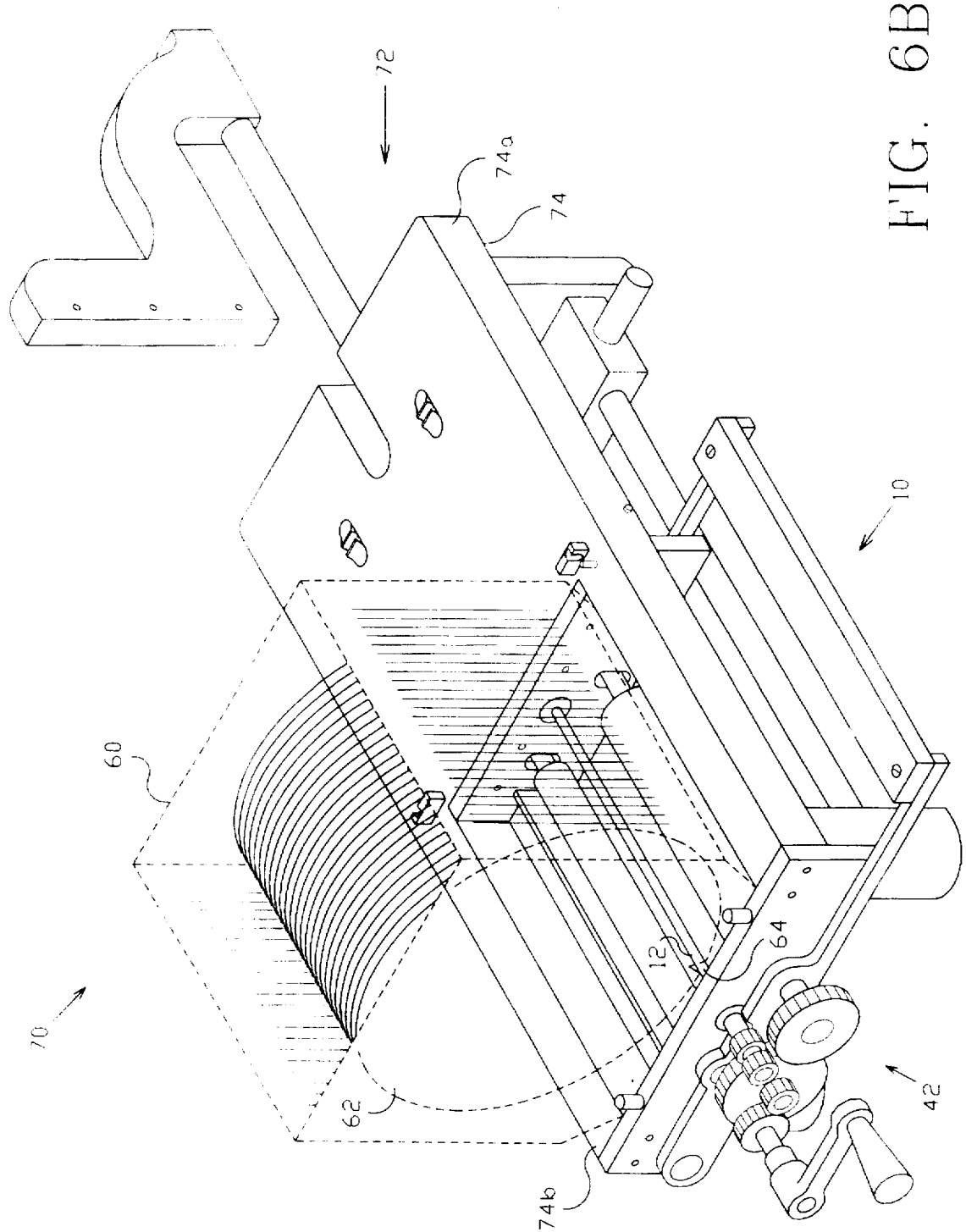
FIG. 6B is an isometric view of the combination notch finder and wafer transfer machine of FIG. 6 showing a wafer carrier in place on the machine for performing the notch finding function.

Referring now to FIGS. 6-7, a combination notch finder and wafer transfer machine 70 incorporates into one machine the manual notch finder and positioning machine described above and a conventional wafer transfer machine. The notch finder and positioning machine portion of the combined machine 70 is designated by reference numeral 10. The wafer transfer machine portion of the combined machine 70 is designated by reference numeral 72. Wafer transfer machine portion 72 includes a base plate 74 and a translatable transfer arm 76. Base plate 74 has a generally rectangular first portion 74a and a U-shaped second portion 74b. As shown in FIG. 6A, the wafer carriers 60 (shown schematically in dotted lines) used in the transfer of wafers are located on first and second portions 74a and 74b of base plate 74 during transfer operations. As shown in FIG. 6B, a single wafer carrier 60 (shown schematically in dotted lines) is located on second portion 74b of base plate 74 during notch finding operations.

The notch finder machine portion of the combined machine is mounted on second portion 74b of base plate 74. Transfer arm 76 has a transfer end 76a and a translation end 76b. The translation of transfer arm 76 is by means of slide rod 78. One end of slide rod 78 is attached to translation end 76b of transfer arm 76. The other end of slide rod 78 is attached to slide block 80. Slide block 80 is mounted on and slides along slide rails 82. Slide rails 82 are mounted parallel to the longitudinal axis of base plate 74 between two pairs of legs 84, 86. Legs 84, 86 are mounted to the bottom of base plate 74. Preferably, legs 84, 86 are positioned on base plate 74 to block the movement of slide block 80 and thereby limit the range of motion of transfer arm 76. Axial positioners 88 are mounted on base plate 74. Axial positioners locate the transferor and transferee wafer carriers (not shown) on base plate 74. The axial positioners illustrated in FIGS. 6 and 7 are designed for use with an "H" bar type wafer carrier, such as the Flouroware, Inc. A200-80 and A196-60 series wafer carriers. Different positioners may be used, as necessary, to accommodate other types of wafer carriers.

The notch finder and positioning machine 10 of the combined machine 70 is mounted to U-shaped second portion 74b of base plate 74. Second portion 74b of base plate 74 serves as the frame 34 of notch finder machine 10. Second side plate 16 is mounted to the web portion of U-shaped second portion 74b of base plate 74. First side plate 14 is mounted across the flange portions of second portion 74b of base plate 74. Wafer carrier guides 35 are positioned along the flange portions of second portion 74b of base plate 74.

The invented combination machine also includes a transfer safety lockout device 92 which selectively prevents transfer arm 76 from moving to transfer or push wafers out of a transferor carrier. Lockout device 92 includes a stop 94 and a release pin 96. Stop 94 is constructed as a flat rectangular plate having a forward portion 94a and a rearward portion 94b. Stop 94 is mounted to base plate 74 by pivot pin 98. Release pin 96 extends through base plate 74 above the rearward portion 94b of stop 94. Stop 94 pivots on pivot pin 98 about a pivotal axis located somewhat rearward of the center of stop 94. Lockout device 92 is operative between an engaged position wherein forward portion 94a of stop 94 is down, as shown by the solid lines in FIG. 6, and a disengaged position wherein the forward portion 94a of stop 94 is up, as shown in FIG. 6A. When lockout device 92 is in the engaged position, stop 94 prevents transfer arm 76 from moving to push wafers out of a transferor carrier by blocking slide block 80. When lockout device 92 is in the disengaged position, stop 94 does not block slide block 80 and transfer arm 76 may be moved to push wafers out of a transferor carrier.

In operation, forward portion 94a of stop 94 is biased down under the force of gravity. In this way, lockout device 92 is placed in the engaged position at any time transfer arm 76 is withdrawn from a transferor carrier. Release 96 is sufficiently lightweight so as not to prevent forward portion 94a of stop 94 from falling down under the force of gravity. Alternatively, forward portion 94a of stop 94 can be biased down using a spring or other suitable biasing mechanism. Lockout device 92 is disengaged by depressing release pin 96 to pivot forward portion 94a of stop 94 up and out of the way of slide block 80. Preferably, release pin 96 is located so that it will depress automatically only when a receiver carrier is properly positioned on base plate 74, or if manually depressed by an operator.

Figure 8:
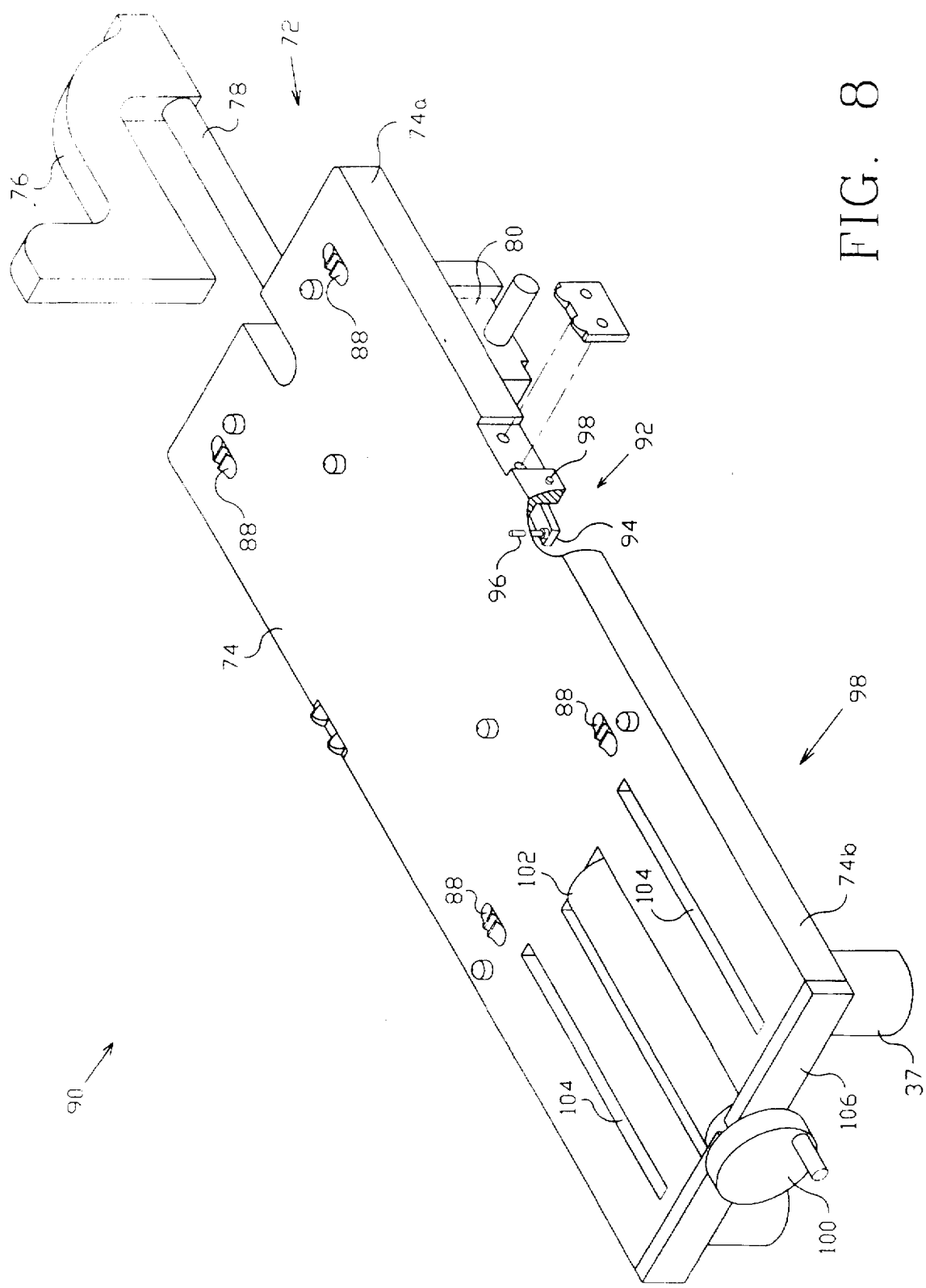
FIG. 8 is an isometric view of the combination flat finder and wafer transfer machine.
Figure 8A:
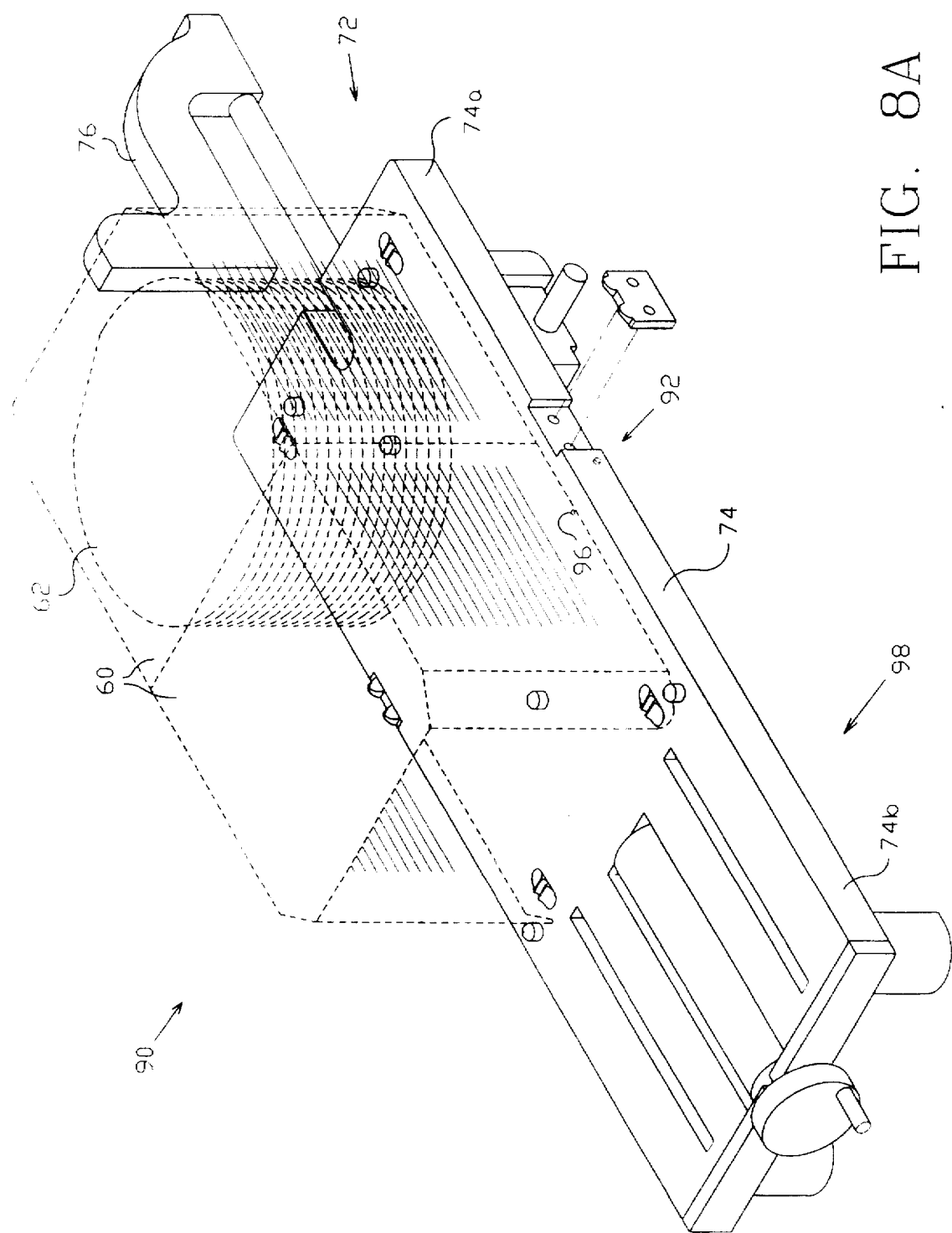
FIG. 8A is an isometric view of the combination flat finder and wafer transfer machine of FIG. 8 showing a pair of wafer carriers in place on the machine for performing the wafer transfer function.
Figure 8B:
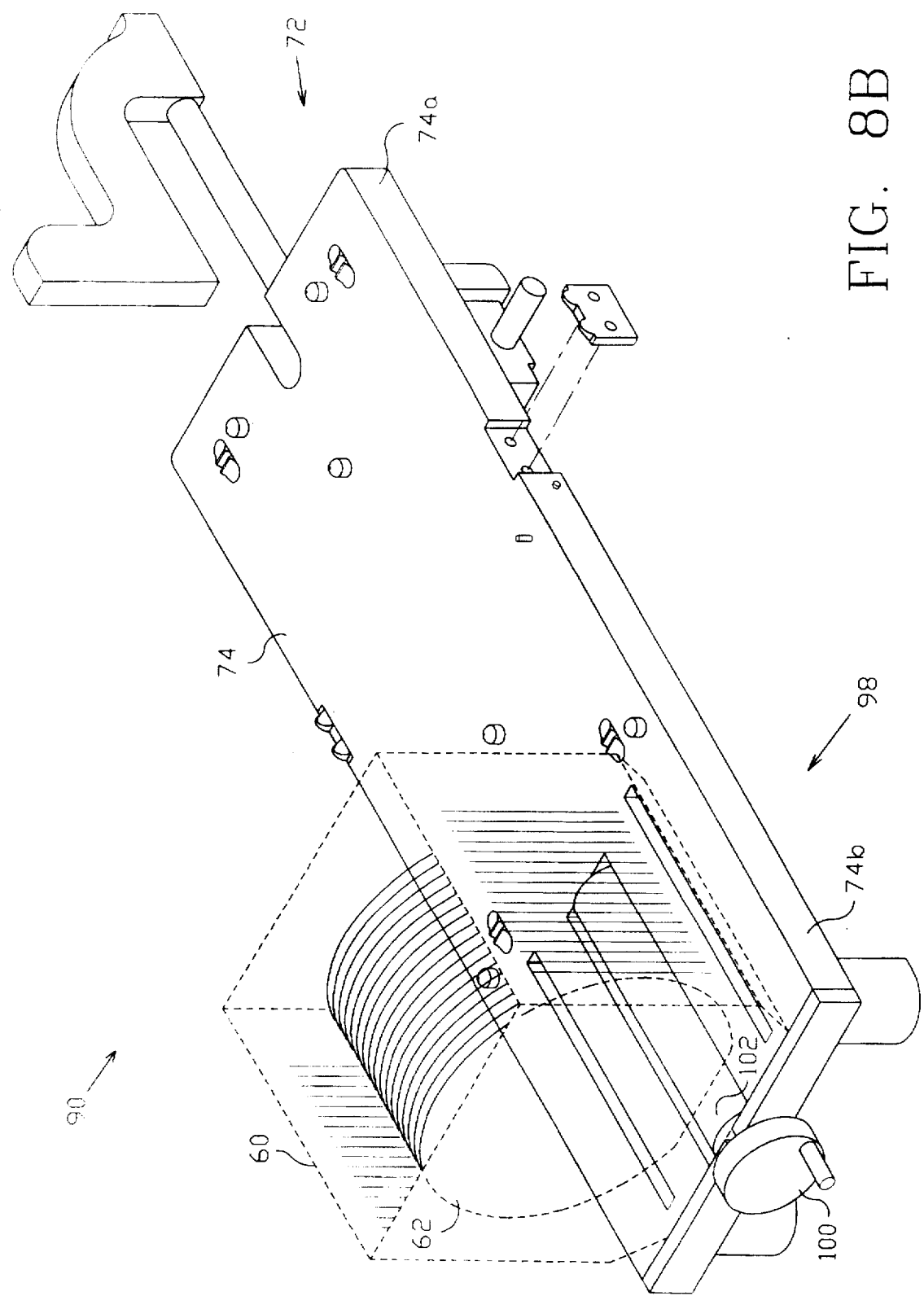
FIG. 8B is an isometric view of the combination flat finder and wafer transfer machine of FIG. 8 showing a wafer carrier in place on the machine for performing the flat finding function.

A combination flat finder and wafer transfer machine 90 is illustrated in FIGS. 8, 8A and 8B. Machine 90 incorporates into one machine the operative components of conventional manual flat finding and wafer transfer machines. The wafer transfer machine portion 92 of the combined machine 90 includes a base plate 74 and a translatable transfer arm 76. Base plate 74 has a first portion 74a and a second portion 74b. As shown in FIG. 8A, the wafer carriers 60 (shown schematically in dotted lines) used in the transfer of wafers are located on first portion 74a of base plate 74 during transfer operations. As shown in FIG. 8B, a single wafer carrier 60 (shown schematically in dotted lines) is located on second portion 74b of base plate 74 during flat finding operations.

The flat finding machine portion, designated by reference numeral 98, includes a hand crank 100, roller 102 and wafer carrier guides 104. Roller 102 is rotatably mounted in and supported by base plate 74 at one end and by end plate 106 at its other end. Hand crank 100 is operatively coupled to roller 102. Hand crank 100 may be connected directly to roller 102 or connected through a gear train as described above for the manual notch finder. Hand crank 100 will be connected directly to roller 102 in most applications because roller 102 can be made sufficiently large to quickly rotate the wafers for alignment according to the flat portion formed along the edge of the wafers.

Conventional bushings or bearings may be used for all moving parts to minimize surface wear. The structural components of the invented machines may be made of any suitable structurally stable corrosion resistant material, such as polypropylene, aluminum or stainless steel. Bearing surface materials are preferably made of stainless steel to minimize the risk of contaminating the wafers and to reduce wear on the contact surfaces.

While there is shown and described the preferred embodiments of the invention, it is to be understood that this invention is not limited thereto but may be variously embodied to practice within the scope of the following claims.

What is claimed is:

1. A manually operated machine for radially aligning one or more semiconductor wafers according to a notch formed in the edge of each wafer, the machine comprising:
   a. an elongated roller configured to engage an edge of each of the wafers;
   b. a hand crank; and
   c. a gear train operatively connected between the roller and the hand crank.

2. A manually operated machine for radially aligning one or more semiconductor wafers according to a notch formed in the edge of each wafer, the machine comprising:
   a. an elongated roller configured to engage an edge of each of the wafers;
   b. a hand crank;
   c. a drive gear connected to the hand crank; and
   d. a roller gear connected to the roller, the roller gear being disposed laterally adjacent to and aligned with the drive gear so that the drive gear engages the roller gear.

3. A machine according to claim 2, wherein the drive gear continuously engages the roller gear.

4. A manually operated machine for radially aligning and positioning one or more semiconductor wafers according to a notch formed in the edge of each wafer, the machine comprising:
   a. an elongated first roller configured to engage an edge of each of the wafers when each wafer is in a first position and to fit within the notch and therein operatively disengage the edge of each of the wafers when each wafer is in a second position;
   b. an elongated second roller disposed laterally near the first roller and configured to engage the edge of each of the wafers fully along the edge of each wafer; and
   c. a hand crank operatively coupled to the first roller and the second roller to manually rotate the first roller and the second roller.

5. A manually operated machine for radially aligning and positioning one or more semiconductor wafers according to a notch formed in the edge of each wafer, the machine comprising:
   a. an elongated first roller configured to engage an edge of each of the wafers when each wafer is in a first position and to fit within the notch and therein operatively disengage the edge of each of the wafers when each wafer is in a second position;
   b. an elongated second roller disposed laterally near the first roller and configured to engage the edge of the wafers fully along the edge of each wafer;
   c. a hand crank;
   d. a drive gear connected to the hand crank;
   e. a first roller gear connected to the first roller, the first roller gear being disposed laterally adjacent to and aligned with the drive gear so that the drive gear engages the first roller gear;
   f. a coupling gear connected to the first roller gear; and
   g. a second roller gear connected to the second roller, the second roller gear being disposed laterally adjacent to and aligned with the coupling gear so that the coupling gear engages the second roller gear.

6. A manually operated machine for radially aligning and positioning one or more semiconductor wafers according to a notch formed in the edge of each wafer, the machine comprising:
   a. an elongated first roller configured to engage an edge of each of the wafers when each wafer is in a first position and to fit within the notch and therein operatively disengage the edge of each of the wafers when each wafer is in a second position;
   b. an elongated second roller disposed laterally near the first roller and configured to engage the edge of each of the wafers fully along the edge of each wafer;
   c. a hand crank operatively coupled to the first and second rollers to manually rotate the first and second rollers; and
   d. a selection mechanism for selectively coupling and de-coupling the hand crank to the second roller and for simultaneously engaging and disengaging the second roller against the edge of the wafers.

7. A machine according to claim 6, wherein the selection mechanism is operative between a first position wherein the second roller is de-coupled from the hand crank and disengaged from the edge of the wafers, and a second position wherein the second roller is coupled to the hand crank and engaged against the edge of the wafers and the first roller is disengaged from the edge of the wafers.

8. A manually operated machine for radially aligning and positioning one or more semiconductor wafers according to a notch formed in the edge of each wafer, the machine comprising:
   a. an elongated first roller configured to engage an edge of each of the wafers when each wafer is in a first position and to fit within the notch and therein operatively disengage the edge of each of the wafers when each wafer is in a second position;
   b. an elongated second roller disposed laterally near the first roller and configured to engage the edge of each of the wafers fully along the edge of each wafer;
   c. a hand crank;
   d. a drive gear connected to the hand crank;
   e. a first roller gear connected to the first roller, the first roller gear being disposed laterally adjacent to and aligned with the drive gear so that the drive gear engages the first roller gear;
   f. a coupling gear connected to the first roller gear;

g. a second roller gear connected to the second roller, the second roller gear being disposed laterally adjacent to and aligned with the coupling gear for selective engagement therewith; and h. a selection mechanism for selectively engaging and disengaging the coupling gear and the second roller gear, to thereby selectively couple and de-couple the hand crank and the second roller, and for simultaneously engaging and disengaging the second roller against the edge of the wafers.

9. A combination wafer notch finder and transfer machine, comprising:

a. a base plate;

b. a transfer arm proximate one end of the base plate, the transfer arm movable across at least a part of the base plate;

c. an elongated roller;

d. a hand crank; and e. a gear train operatively connected between the roller and the hand crank.

10. A machine according to claim 9, further comprising a lockout device for selectively preventing the transfer arm from moving to push wafers out of a wafer carrier positioned on the base plate.

11. A machine according to claim 10, wherein the lockout device comprises:

a. a stop pivotally mounted to a bottom surface of the base plate, the stop having a pivotal axis defining a forward portion and a rearward portion, the pivotal axis being disposed rearward of a center of the stop;

b. a release pin slidably inserted through the base plate at a location above the rearward portion of the stop, the release pin having a first end contacting the rearward portion of the stop and a second end extending above a top surface of the base plate; and c. the lockout device being operative between an engaged position wherein the forward portion of the stop is pivoted down to prevent the transfer arm from moving to push wafers out of the transferor carrier and a disengaged position wherein the release pin is depressed to pivot the forward portion of the stop up to allow the transfer arm to move to push wafers out of the transferor carrier.

12. A combination wafer notch finder and transfer machine, comprising:

a. a base plate having a first portion and a generally U-shaped second portion, the U-shaped second portion characterized by flange portions and a web portion extending between the flange portions;

b. a transfer arm proximate the first portion of the base plate, the transfer arm movable across at least a part of the first portion of the base plate; and c. a notch finder assembly mounted to the second portion of the base plate, the notch finder assembly comprising, i) a pair of spaced apart side plates, a first one of the side plates mounted to the web portion and a second one of the side plates mounted across the flange portions, ii) an elongated roller extending between the side plates, iii) a hand crank, and iv) a gear train operatively connected between the hand crank and the roller.

13. A combination wafer notch finder and transfer machine, comprising:

a. a base plate having a first portion and a generally U-shaped second portion, the U-shaped second portion characterized by flange portions and a web portion extending between the flange portions;

b. a transfer arm proximate the first portion of the base plate, the transfer arm movable across at least a part of the first portion of the base plate; and c. a notch finder assembly mounted to the second portion of the base plate, the notch finder assembly comprising, i) a pair of spaced apart side plates, a first one of the side plates mounted to the web portion and a second one of the side plates mounted across the flange portions, ii) an elongated first roller extending between the side plates, the first roller configured to engage an edge of each of the wafers when each wafer is in a first position and to fit within the notch and therein operatively disengage the edge of each of the wafers when each wafer is in a second position, iii) an elongated second roller extending between the side plates and disposed laterally near the first roller, the second roller configured to engage the edge of each of the wafers fully along the edge of each wafer, iv) a hand crank, and v) a gear train operatively connected between the hand crank and the first and second rollers.

14. A combination wafer alignment and transfer machine, comprising:

a. a base plate;

b. a transfer arm proximate one end of the base plate, the transfer arm movable across at least a part of the base plate;

c. an elongated roller mounted to the base plate opposite the transfer arm; and d. a hand crank operatively coupled to the roller.

15. A machine according to claim 14, further comprising a lockout device for selectively preventing the transfer arm from moving to push wafers out of a wafer carrier positioned on the base plate.

16. A machine according to claim 15, wherein the lockout device comprises:

a. a stop pivotally mounted to a bottom surface of the base plate, the stop having a pivotal axis defining a forward portion and a rearward portion, the pivotal axis being disposed rearward of a center of the stop;

b. a release pin slidably inserted through the base plate at a location above the rearward portion of the stop, the release pin having a first end contacting the rearward portion of the stop and a second end extending above a top surface of the base plate; and c. the lockout device being operative between an engaged position wherein the forward portion of the stop is pivoted down to prevent the transfer arm from moving to push wafers out of the wafer carrier and a disengaged position wherein the release pin is depressed to pivot the forward portion of the stop up to allow the transfer arm to move to push wafers out of the transferor carrier.

* * * * *